(12) United States Patent
Ganguli et al.

(10) Patent No.: US 11,869,806 B2
(45) Date of Patent: Jan. 9, 2024

(54) METHODS OF FORMING MOLYBDENUM CONTACTS

(71) Applicant: Applied Materials, Inc., Santa Clara, CA (US)

(72) Inventors: Seshadri Ganguli, Sunnyvale, CA (US); Jacqueline S. Wrench, San Jose, CA (US); Yixiong Yang, Fremont, CA (US); Yong Yang, Tengzhou (CN); Srinivas Gandikota, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 294 days.

(21) Appl. No.: 17/314,515

(22) Filed: May 7, 2021

(65) Prior Publication Data
US 2022/0359281 A1 Nov. 10, 2022

(51) Int. Cl.
*H01L 21/768* (2006.01)
*H01L 21/02* (2006.01)

(52) U.S. Cl.
CPC .. *H01L 21/76877* (2013.01); *H01L 21/02068* (2013.01); *H01L 21/76831* (2013.01)

(58) Field of Classification Search
CPC .......... H01L 21/0228; H01L 21/76877; H01L 21/3141; H01L 21/02194; H01L 21/76831; H01L 29/517
See application file for complete search history.

(56) References Cited

U.S. PATENT DOCUMENTS

| 7,646,046 B2 | 1/2010 | Russ et al. | |
|---|---|---|---|
| 2013/0078819 A1* | 3/2013 | Sun | H01L 21/306 257/E21.271 |
| 2017/0175258 A1* | 6/2017 | Robinson | C23C 16/305 |
| 2018/0127873 A1* | 5/2018 | Sarnet | C23C 16/305 |
| 2018/0286668 A1* | 10/2018 | Baum | C23C 16/14 |
| 2018/0312966 A1* | 11/2018 | Chan | H01L 21/28562 |
| 2019/0067014 A1* | 2/2019 | Shrestha | H01L 21/76877 |
| 2019/0067094 A1 | 2/2019 | Zope et al. | |
| 2019/0157102 A1 | 5/2019 | Jian et al. | |

(Continued)

FOREIGN PATENT DOCUMENTS

| DE | 69121451 T2 | 2/1997 |
| JP | 2001284548 A | 10/2001 |
| WO | 2020106649 A1 | 5/2020 |

OTHER PUBLICATIONS

PCT International Search Report and Written Opinion in PCT/US2022/027991 dated Aug. 26, 2022, 10 pages.

*Primary Examiner* — Jaehwan Oh
*Assistant Examiner* — John M Parker
(74) *Attorney, Agent, or Firm* — Servilla Whitney LLC

(57) ABSTRACT

Methods for forming a semiconductor structure are described. The method includes cleaning a substrate to form a substrate surface substantially free of oxide, exposing the substrate surface to a first molybdenum precursor, and exposing the substrate surface to a reactant to selectively deposit a first molybdenum film on the substrate surface. The method may be performed in a processing chamber without breaking vacuum. The method may also include forming one or more of a cap layer and a liner and annealing the substrate. The method may also include depositing a second molybdenum film on the substrate surface.

16 Claims, 10 Drawing Sheets

(56) References Cited

U.S. PATENT DOCUMENTS

| | | |
|---|---|---|
| 2021/0054500 A1* | 2/2021 | Zope .................. C23C 16/45525 |
| 2021/0087677 A1* | 3/2021 | Wong .................. C23C 16/0227 |
| 2021/0098584 A1 | 4/2021 | Cheng et al. |
| 2021/0119037 A1 | 4/2021 | Li et al. |
| 2021/0123139 A1 | 4/2021 | Zhou et al. |
| 2021/0143278 A1 | 5/2021 | Wang et al. |

* cited by examiner

METHODS OF FORMING MOLYBDENUM CONTACTS

TECHNICAL FIELD

Embodiments of the present disclosure pertain to the field of semiconductor devices and semiconductor device manufacturing. More particularly, embodiments of the disclosure relate to methods of selectively forming molybdenum contacts.

BACKGROUND

The semiconductor processing industry continues to strive for larger production yields while increasing the uniformity of layers deposited on substrates having larger surface areas. These same factors, in combination with new materials, also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) and atomic layer deposition (ALD) are common deposition processes employed for depositing layers on a substrate. CVD is a flux-dependent deposition technique that requires precise control of the substrate temperature and the precursors introduced into the processing chamber in order to produce a desired layer of uniform thickness. A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface.

The advancing complexity of advanced microelectronic devices is placing stringent demands on currently used deposition techniques. Molybdenum and molybdenum-based films have attractive material and conductive properties. These films have been proposed and tested for applications from front end to back end parts of semiconductor and microelectronic devices.

Current methods of cleaning substrates having both metal and dielectric surfaces rely on alternating oxidation and reduction reactions to both remove contaminants and undo any damage caused by the other reaction. Most cleaning processes require at least three oxidation or reduction reaction processes to sufficiently clean the substrate surfaces. Yet, the oxidation and reduction reactions are typically performed at different temperatures. Therefore, a substrate often must be heated or cooled between processes. Further, the process gases used for oxidation and reduction reactions are often incompatible. Therefore, a substrate often must be transferred from one processing chamber to another for different processes.

Therefore, there is a need in the art developing methods to remove contaminants and deposit metal films on the substrate.

SUMMARY

One or more embodiments of the disclosure are directed to a method of forming a semiconductor structure. In one or more embodiments, the method comprises cleaning a substrate to form a substrate surface substantially free of oxide; exposing the substrate surface to a first molybdenum precursor; and exposing the substrate surface to a reactant to selectively deposit a first molybdenum film on the substrate surface. In one or more embodiments, the method is performed in a processing chamber without breaking vacuum.

Another embodiment of the disclosure is directed to a method of forming a semiconductor structure without breaking a vacuum. In one or more embodiments, the method comprises: cleaning the substrate to form a substrate surface substantially free of oxide, the substrate surface comprising at least one feature; performing a first operation on the substrate surface, the first operation comprising exposing the substrate surface to a first molybdenum precursor and exposing the substrate surface to a reactant to selectively deposit a first molybdenum film on the substrate surface; treating the substrate surface to form one or more of a cap and a liner; and annealing the substrate.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

Figure 1A:
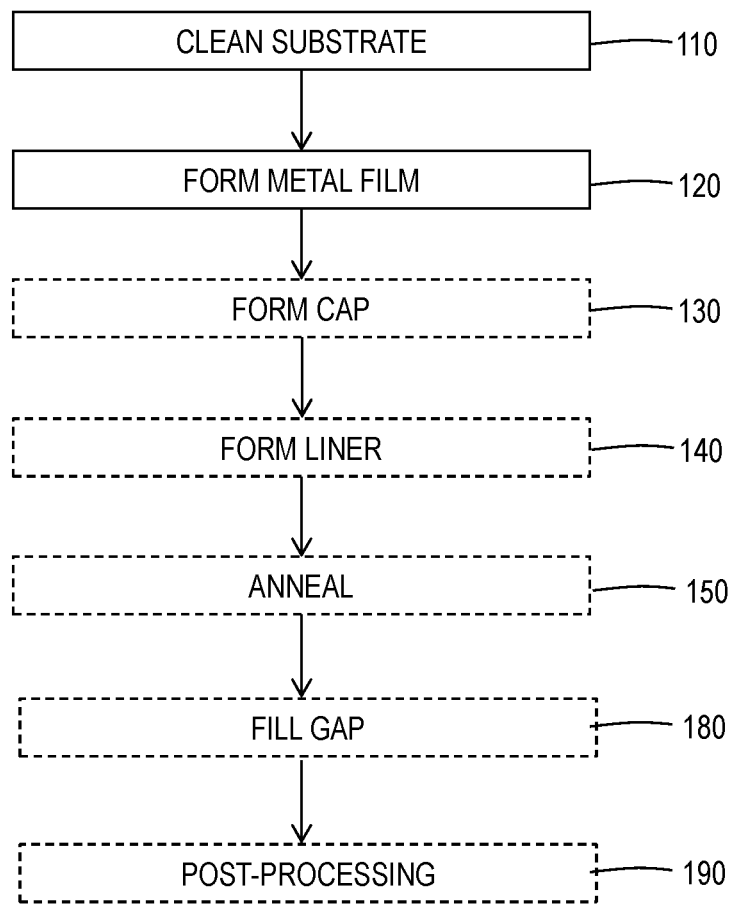
FIG. 1A illustrates a process flow diagram of a method according to one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As use herein, the term "substrate," refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

Additionally, the term "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, dielectric materials, other conductive materials, or combinations thereof, depending on the application. In some embodiments, the substrate comprises silicon (Si), ruthenium (Ru), cobalt (Co), tungsten (W), silicon phosphide (SiP), titanium silicon (TiSi), titanium nitride (TiN), titanium aluminide (TiAl), silicon germanium (SiGe), silicon germanium boron (SiGeB), hafnium oxide ($HfO_2$), aluminum oxide ($Al_2O_3$) or combinations thereof. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

As used herein, the term "substrate surface" refers to any substrate surface upon which a layer may be formed. The substrate surface may have one or more features formed therein, one or more layers formed thereon, and combinations thereof. The shape of the feature can be any suitable shape including, but not limited to, peaks, trenches, and cylindrical vias. As used in this regard, the term "feature" refers to any intentional surface irregularity. Suitable examples of features include but are not limited to trenches which have a top, two sidewalls and a bottom, peaks which have a top and two sidewalls extending upward from a surface, and vias which have sidewalls extending down from a surface with an open bottom. Features can have any suitable aspect ratio (ratio of the depth of the feature to the width of the feature). In some embodiments, the feature has an aspect ratio in a range of from 3:1 to 15:1, from 6:1 to 15:1, from 9:1 to 15:1, from 12:1 to 15:1, from 3:1 to 12:1, from 6:1 to 12:1, from 9:1 to 12:1, from 3:1 to 9:1, from 6:1 to 9:1 or from 3:1 to 6:1.

As used in this specification and the appended claims, the terms "reactive compound", "reactive gas", "reactive species", "precursor", "process gas" and the like," are interchangeable and refer to any gaseous species that can react with the substrate surface or material on the substrate surface in a surface reaction (e.g., chemisorption, oxidation, reduction). In one or more embodiments, the reactive compound is volatile and thermally stable, and, thus, suitable for vapor deposition.

As used herein, the term "processing chamber" includes portions of a processing chamber adjacent the substrate surface without encompassing the complete interior volume of the processing chamber. For example, in a sector of a spatially separated processing chamber, the portion of the processing chamber adjacent the substrate surface is purged of one or more reactive compounds by any suitable technique including, but not limited to, moving the substrate through a gas curtain to a portion or sector of the processing chamber that contains none or substantially none of the reactive compounds.

As used herein, the term "atomic layer deposition" or "cyclical deposition" refers to the sequential exposure of two or more reactive compounds to deposit a layer of material on a substrate surface. The substrate, or portion of the substrate surface is exposed sequentially to the two or more reactive compounds which are introduced into a reaction zone of a processing chamber. The sequential exposure of the reactive gases prevents or minimizes gas phase reactions between the reactive gases. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness. In one or more embodiments, the time-domain ALD process can be performed with more than two reactive compounds in a predetermined sequence.

In an aspect of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. In one or more embodiments, the spatial ALD process can be performed with more than two reactive compounds in a predetermined sequence.

In some embodiments, the substrate surface is exposed to the first reactive compound and the second reactive compound substantially sequentially. As used herein throughout the specification, "substantially sequentially" means that most of the duration of the first reactive compound exposure does not overlap with the second reactive compound exposure, although there may be some overlap.

As used herein, the term "chemical vapor deposition" refers to the exposure of at least one reactive compound to deposit a layer of material on the substrate surface. In some embodiments, the chemical vapor deposition (CVD) process comprises mixing the two or more reactive compounds in the processing chamber to allow gas phase reactions of the reactive compounds and deposition. In some embodiments, the CVD process comprises exposing the substrate surface to two or more reactive compounds simultaneously. In some embodiments, the CVD process comprises exposing the substrate surface to a first reactive compound continuously with an intermittent exposure to a second reactive compound. In some embodiments, the substrate surface undergoes the CVD reaction to deposit a film having a predetermined thickness. In the CVD process, the film can be deposited in one exposure to the mixed reactive compounds, or can be multiple exposures to the mixed reactive compounds with purges between. In some embodiments, the substrate surface is exposed to the first reactive compound and the second reactive compound substantially simultaneously.

As used herein throughout the specification, "substantially simultaneously" means that most of the duration of the first reactive compound exposure overlaps with the second reactive compound exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the first reactive compound is purged from the reaction chamber for a time duration in a range of from 0.2 seconds to 30 seconds, from 0.2 seconds to 10 seconds, from 0.2 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive compound.

As used herein, the term "liner" refers to a layer conformably formed along at least a portion of the sidewalls and/or lower surface of an opening such that a substantial portion of the opening prior to the deposition of the layer remains unfilled after deposition of the layer. The liner may be formed along the entirety of the sidewalls and lower surface of the opening. The liner can be formed by any process known to a person skilled in the art. In some embodiments, the liner comprises a metal nitride, a PVD metal or combinations thereof.

Embodiments of the disclosure provide methods for forming a semiconductor structure. In some embodiments, the method comprises selectively depositing metal films on a substrate. In order to achieve minimum contact resistance, the volume of features on a substrate are very small. In one or more embodiments, the substrate comprises silicon or a derivative thereof. In one or more embodiments, methods are advantageously provided to fill a feature with a low resistivity metal and reduce silicide to a minimum at the bottom of the feature.

In some embodiments, a metal precursor is used to form a metal film. In one or more embodiments, when the substrate is exposed to the metal precursor, etching of the underlayer substrate occurs. In some embodiments, the metal film deposits on the substrate surface in an oxygen free environment, which advantageously reduces or eliminates etching of the underlayer substrate. Accordingly, in some embodiments, the degree of etching of the underlayer substrate can be modified by adjusting one or more of the deposition parameters, including, but not limited to, the presence of a reactant, reactant concentration, reactant pulse length, pressure, or temperature.

Figure 1B:
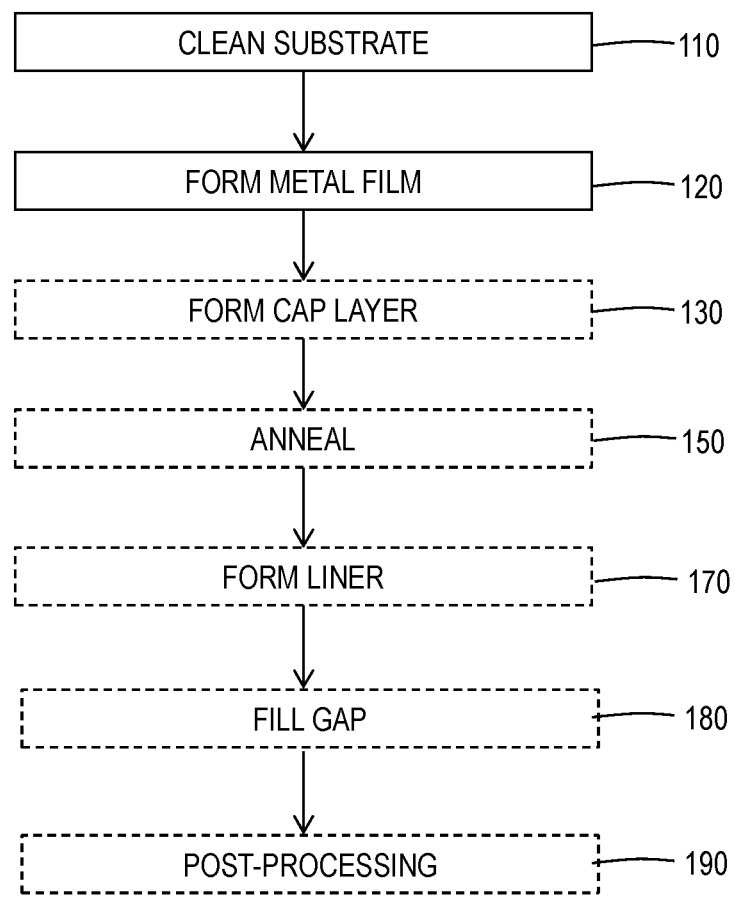
FIG. 1B illustrates a process flow diagram of a method according to one or more embodiments of the disclosure.
Figure 1C:
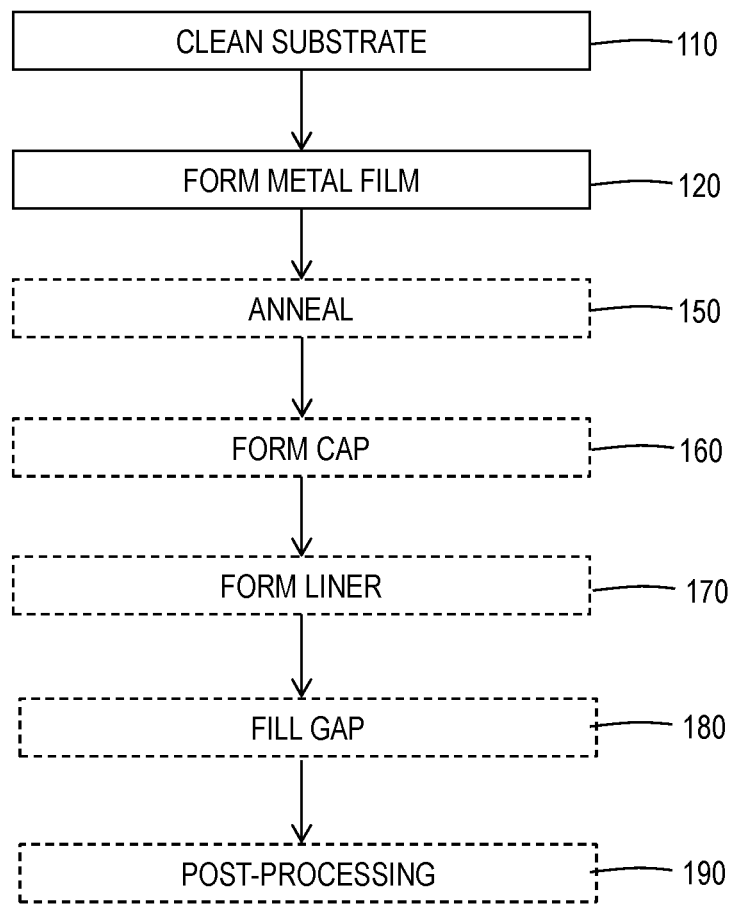
FIG. 1C illustrates a process flow diagram of a method according to one or more embodiments of the disclosure.
Figure 2A:
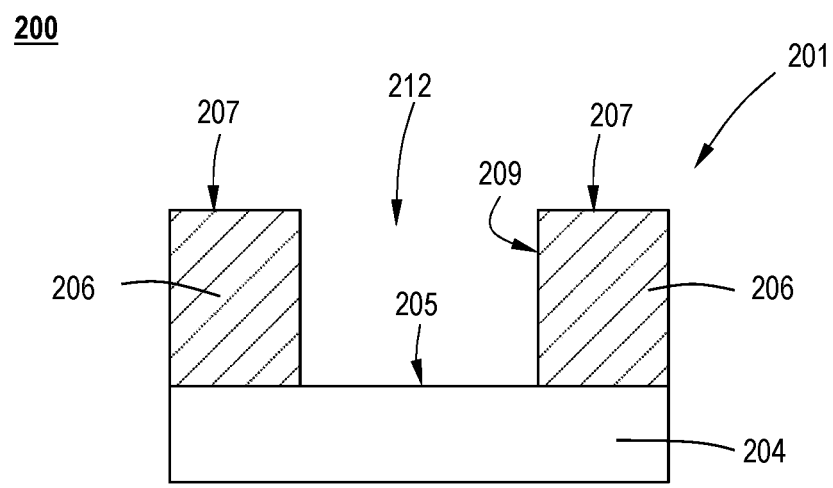
FIGS. 2A-2M illustrate cross-sectional schematic views of a semiconductor device according to one or more embodiments of the disclosure.

FIGS. 1A through 1C illustrate process flow diagrams of a method 100 directed to forming a semiconductor structure according to one or more embodiments of the disclosure. FIGS. 2A through 2M illustrate cross-sectional schematic views of a semiconductor device 200 according to one or more embodiments of the disclosure. Referring to FIG. 2A, the semiconductor device 200 comprises a substrate 201. The substrate 201 has a first material 204 with a first surface 205 and a second material 206 with a second surface 207 and a third surface 209.

In some embodiments, the first material 204 comprises a metal, an alloy, a nitride, or combinations thereof. In some embodiments, the alloy comprises silicon germanium (SiGe).

In some embodiments, the second material 206 comprises an oxide, a dielectric, or combinations thereof. In some embodiments, the second material 206 comprises one or more of silicon dioxide ($SiO_2$), silicon nitride (SiN), hafnium oxide ($HfO_2$), aluminum oxide ($Al_2O_3$), a low-k material, or combinations thereof.

With reference to FIG. 2A, the semiconductor device 200 has at least one feature 212 formed therein. Those skilled in the art will understand that the single feature 212 shown in FIG. 2 is for illustrative purposes and that there can be more than one feature. The shape of the feature 212 can be any suitable shape including, but not limited to, peaks, trenches, and cylindrical vias. In the embodiment shown, the feature 212 is a trench. The trench has a bottom formed by the first surface 205 and sidewalls 209 formed by the third surface 209. In other specific embodiments, the feature 212 is a via. In some embodiments, the feature 212 comprises an aspect ratio in a range of from 3:1 to 15:1, from 6:1 to 15:1, from 9:1 to 15:1, from 12:1 to 15:1, from 3:1 to 12:1, from 6:1 to 12:1, from 9:1 to 12:1, from 3:1 to 9:1, from 6:1 to 9:1 or from 3:1 to 6:1.

With reference to FIG. 1A and FIG. 2A, at operation 110, the method 100 includes cleaning the substrate 201 (or substrate surface). In some embodiments, cleaning the substrate 201 (or substrate surface) removes oxides from the substrate surface. In some embodiments, the oxides are native oxide. In some embodiments, cleaning the substrate surface at operation 110 forms a substrate surface that is substantially free of oxide. As used in this manner, the term "substantially free of oxide" means that there are less than or equal to 5%, 2%, 1% or 0.5% of oxygen atoms on the substrate surface. In one or more embodiments, anisotropic etching is used to remove oxide from the substrate surface.

In one or more embodiments, anisotropic etching removes oxide more from the first surface 205 than the second material 206. In one or more embodiments, cleaning the substrate surface at operation 110 forms the first surface 205 that is substantially free of oxide.

Figure 2B:
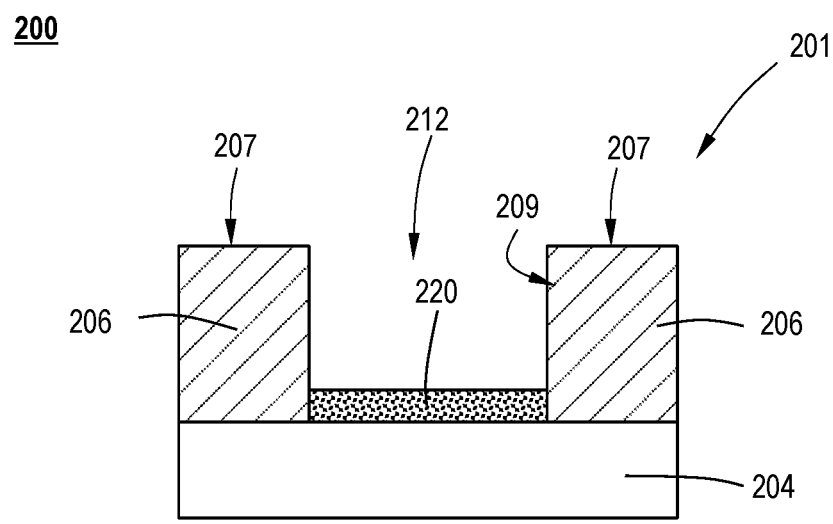

With reference to FIG. 1A and FIG. 2B, at operation 120, a first metal film 220 is selectively formed on the first substrate surface 205. In some embodiments, the operation 130 comprises exposing the substrate 201 (or substrate surface) to a first metal precursor and exposing the substrate 201 (or substrate surface) to a first reactant. The first metal film 220 can be deposited by the ALD deposition process, the CVD deposition process or combinations thereof.

In one or more embodiments, the first metal film 220 comprises a first metallic film. In some embodiments, the first metallic film comprises a first molybdenum film.

In one or more embodiments, formation of the first metal film 220 is a selective deposition process. The first metal film 220 only forms on a metal surface wherein oxides have been removed, for example by cleaning, on certain nitride materials, and on silicon containing substrates. In one or more specific embodiments, the first material 204 comprises silicon or silicon germanium and the second material 206 comprises a silicon substrate that has not been cleaned or a dielectric material such as silicon nitride (SiN), hafnium oxide ($HfO_2$), or aluminum oxide ($Al_2O_3$). In one or more embodiments, the first metal film 220 selectively forms on the first surface 205 of the first material 204 and not on the surfaces of the second material 206.

In one or more embodiments, the first metal precursor comprises a first molybdenum precursor. In some embodiments, the first molybdenum precursor comprises a molybdenum halide. In some embodiments, the molybdenum halide comprises molybdenum fluoride, molybdenum chloride, or combinations thereof. In specific embodiments, the first molybdenum precursor comprises molybdenum fluoride. In other specific embodiments, the first molybdenum precursor comprises molybdenum chloride. In one or more embodiments, the first precursor is flowed over the substrate surface using a carrier gas. In some embodiments, the carrier gas is flowed through an ampoule comprising the first precursor. In some embodiments, the carrier gas in an inert gas. In some embodiments, the inert gas comprises one or more of $N_2$, Ar, and He.

In one or more embodiments, the first reactant comprises an oxidizing agent, a reducing agent, or combinations thereof. In some embodiments, the first reactant comprises hydrogen ($H_2$), ammonia ($NH_3$), silane, polysilane, or combinations thereof. In some embodiments, silane is selected from one or more of disilane, trisilane, tetrasilane, higher order silanes, and substituted silane. In specific embodiments, the first reactant comprises hydrogen ($H_2$). In other specific embodiments, the reactant comprises ammonia ($NH_3$). In one or more embodiments, the first reactant is flowed over the substrate using a carrier gas. In some embodiments, the carrier gas in an inert gas. In some embodiments, the inert gas comprises one or more of $N_2$, Ar, and He. In other embodiments, the reactant gas may be flowed continuously and the molybdenum precursor flow to the chamber is turned on and off.

In one or more embodiments, the substrate surface is exposed to the first precursor, e.g., molybdenum halide, comprising the carrier gas, e.g., Ar, at a flowrate in a range of from 100 slm to 1000 slm, from 100 slm to 700 slm, from 100 slm to 400 slm, from 400 slm to 1000 slm, from 400 slm to 700 slm or from 700 slm to 1000 slm.

In one or more embodiments, the substrate surface is exposed to the first precursor, e.g., molybdenum halide, for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In one or more embodiments, the substrate surface is exposed to a continuous flow or a plurality of pulses of the first precursor, e.g., molybdenum halide. In some embodiments, the plurality of pulses of the first precursor has a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the first precursor is applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds. In some embodiments, at least one of the plurality of pulses of the first precursor is applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In one or more embodiments, the substrate surface is exposed to the first reactant, e.g., hydrogen ($H_2$) or ammonia ($NH_3$), at a flowrate in a range of from 0.5 slm to 15 slm, from 0.5 slm to 10 slm, from 0.5 slm to 5 slm, from 5 slm to 15 slm, from 5 slm to 10 slm or from 10 slm to 15 slm.

In one or more embodiments, the substrate surface is exposed to the first reactant, e.g., hydrogen ($H_2$) or ammonia ($NH_3$), for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In one or more embodiments, the substrate surface is exposed to a continuous flow or a plurality of pulses of the first reactant, e.g., hydrogen ($H_2$) or ammonia ($NH_3$). In some embodiments, the plurality of pulses of the first reactant has a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the first reactant is applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds. In some embodiments, at least one of the plurality of pulses of the first reactant is applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In one or more embodiments, operation 120 is repeated for a predetermined number of cycles. In some embodiments, operation 120 is repeated until the first film 220 has a predetermined thickness. The predetermined thickness may be in a range of from 10 Å to 50 Å, from 10 Å to 40 Å, from 10 Å to 30 Å, from 10 Å to 20 Å, from 15 Å to 50

Å, from 15 Å to 40 Å, from 15 Å to 30 Å, from 15 Å to 20 Å, from 20 Å to 50 Å, from 20 Å to 40 Å, from 20 Å to 30 Å, from 30 Å to 50 Å, from 30 Å to 40 Å or from 40 Å to 50 Å. In some embodiments, operation 120 is continued for a predetermined duration of time.

In one or more embodiments, operation 120 comprises purging the substrate surface or the processing chamber of the first metal precursor before exposing the substrate 201 (or substrate surface) to the first reactant. In some embodiments, the substrate surface or the processing chamber is purged of the first reactant. The purging may be conducted for a time duration in a range of from 0.2 seconds to 30 seconds, from 0.2 seconds to 10 seconds, from 0.2 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In one or more embodiments, operation 110 and operation 120 are performed without breaking a vacuum. In some embodiments, operation 110 and operation 120 are performed in a processing chamber without breaking a vacuum. Accordingly, in one or more embodiments, the substrate surface is cleaned and then a metal film, e.g., a molybdenum film, is formed on the substrate surface without breaking vacuum between cleaning and forming the metal film. Keeping the cleaning and metal film forming process under vacuum ensures that no oxide is introduced/formed on the substrate surface during the method 100. Cleaning the substrate or substrate surface at operation 110 removes oxides, e.g., native oxides, from the substrate surface. The first reactant comprises a reducing agent, the reducing agent maintains oxygen free conditions during the operation 120.

In one or more embodiments, the method 100 is performed at a pressure in a range of from 2 Torr to 60 Torr, from 2 Torr to 40 Torr, from 2 Torr to 20 Torr, from 20 Torr to 60 Torr, from 20 Torr to 40 Torr or from 40 Torr to 60 Torr.

In one or more embodiments, the processing chamber comprises a pedestal on which the substrate is placed. In some embodiments, operation 120 is performed on the substrate 201 (or substrate surface) in the processing chamber and on the pedestal. In some embodiments, the pedestal is maintained at a temperature in a range of from 350° C. to 550° C., from 350° C. to 500° C., from 350° C. to 450° C., from 350° C. to 400° C., from 400° C. to 550° C., from 400° C. to 500° C., from 400° C. to 450° C., from 450° C. to 550° C., from 450° C. to 500° C. or from 500° C. to 550° C. In one or more embodiments, the method 100 is performed at a temperature in a range of from 400° C. to 425° C.

Figure 2C:
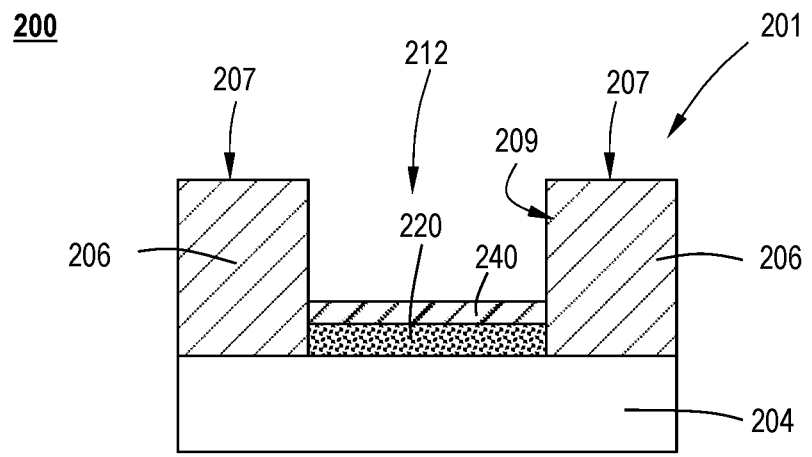

With reference to FIG. 1A, FIG. 1B, and FIG. 2C, in some embodiments, the first metal film 220 is optionally protected from oxide formation with a cap layer 240 at operation 130. The cap layer 240 may be formed by any process known to a person skilled in the art. In some embodiments, the cap layer 240 is formed on the first metal film 220. In some embodiments, the first metal film 220 is treated to form the cap layer 240. In some embodiments, the cap layer 240 is formed by nitridating the first metal film 220. In some embodiments, the cap layer 240 is formed by nitridating the first metal film 220 using ammonia (NH$_3$). In some embodiments, the cap layer 240 is formed by treating the first metal film 220 with plasma to nitridate the first metal film 220. In some embodiments, the plasma treatment comprises nitrogen (N$_2$) plasma treatment. In some embodiments, the cap layer 240 comprises a metal nitride, a PVD metal, or combinations thereof. In one or more embodiments, operation 110, operation 120, and operation 130 are performed without breaking a vacuum. In some embodiments, operation 110, operation 120, and operation 130 are performed in a processing chamber without breaking a vacuum. Accordingly, in one or more embodiments, the substrate surface is cleaned, a metal film, e.g., a molybdenum film, is formed on the substrate surface, and a cap layer is formed on the metal film without breaking vacuum between cleaning, forming the metal film, and forming the cap layer. Keeping the cleaning, the metal film forming process, and the cap layer forming process under vacuum ensures that no oxide is introduced/formed on the substrate surface during the method 100.

Figure 2D:
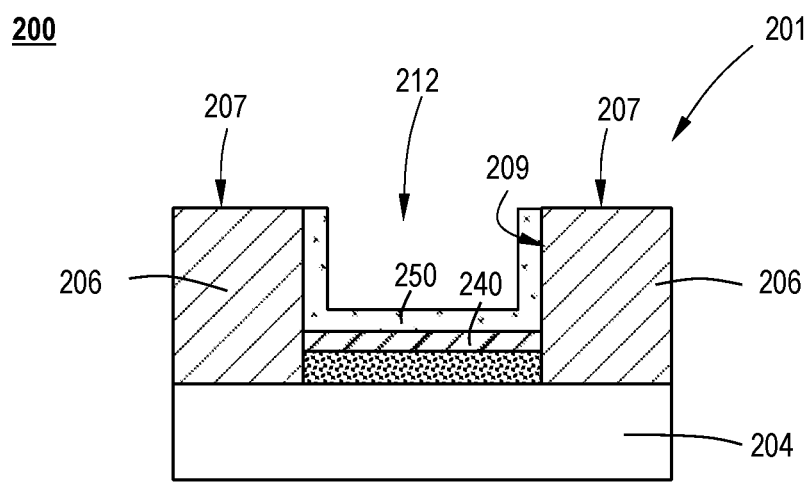

With reference to FIG. 1A and FIG. 2D, in some embodiments, the first metal film 220 is optionally protected from oxide formation with a liner 250 at operation 140. The liner 250 can be formed by any process known to a person skilled in the art. In some embodiments, the liner 250 comprises a metal nitride, a PVD metal, or combinations thereof.

Figure 2E:
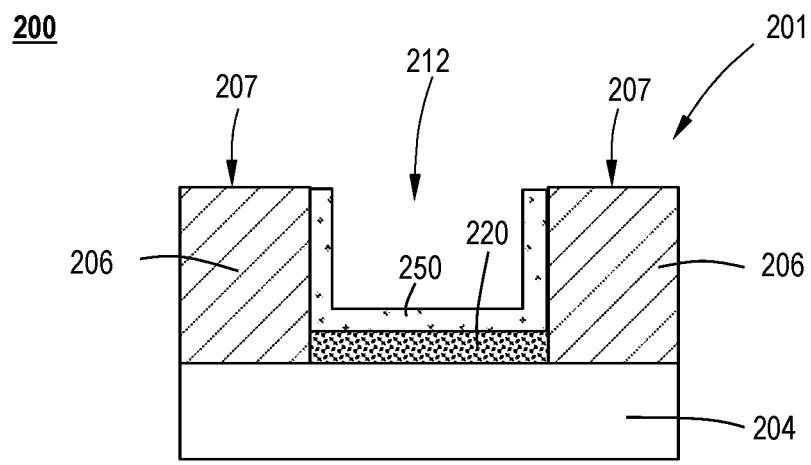

Referring to FIG. 1A and FIG. 2E, in some embodiments, the liner 250 may be formed on the first metal film 220 with no cap layer. With reference to FIG. 1A, FIG. 1B, and FIG. 2D, in some embodiments, the liner 250 may be formed on the cap layer 240, and the cap layer 240 may be formed on the first metal film 220.

In some embodiments, at least operation 110, operation 120 and operation 140 are performed without breaking vacuum. Accordingly, in one or more embodiments, the substrate surface is cleaned, a metal film, e.g., a molybdenum film, is formed on the substrate surface, and a liner is formed on the metal film without breaking vacuum between cleaning, forming the metal film, and forming the liner. In some embodiments, at least operation 110, operation 120, operation 130, and operation 140 are performed without breaking vacuum. Accordingly, in one or more embodiments, the substrate surface is cleaned, a metal film, e.g., a molybdenum film, is formed on the substrate surface, a cap layer is formed on the metal film, and a liner is formed on the cap layer without breaking vacuum between cleaning, forming the metal film, forming the cap layer, and forming the liner.

In another aspect of the disclosure, a method of forming the semiconductor structure 200 includes reducing the contact resistance of the semiconductor structure 200. In some embodiments, the first metal film 220, e.g., molybdenum film, is annealed to form a metal silicide film, e.g., molybdenum silicide. In some embodiments, annealing the first metal film 220 to form a metal silicide film reduces the contact resistance. In one or more embodiments, annealing forms a metal silicide and the resistivity of the metal silicide is higher than the resistivity of the metal film 220. In one or more embodiments, a metal silicide is formed to reduce the contact resistance. If a current were to flow from silicon to the metal film 220, the resistance is high. In one or more embodiments, by making a metal silicide, the resistance of the current flowing through silicon, metal silicide, and metal film is lower.

With reference to FIGS. 1A and 1B, in one or more embodiments, at operation 150, the substrate 201 is annealed. In one or more embodiments, annealing the substrate 201 produces a smooth surface. Accordingly, in some embodiments, the method of forming the semiconductor structure 200 comprises smoothening a surface of the first metal film 120 by annealing. In some embodiments, the substrate surface is not rough after annealing operation 150. Accordingly, in some embodiments, the annealing operation 150 is configured to produce a smooth surface.

The substrate 201 (or substrate surface) can be annealed by any process known to a person skilled in the art. In some embodiments, the substrate 201 (or substrate surface) is annealed by a rapid thermal process (RTP).

Figure 2F:
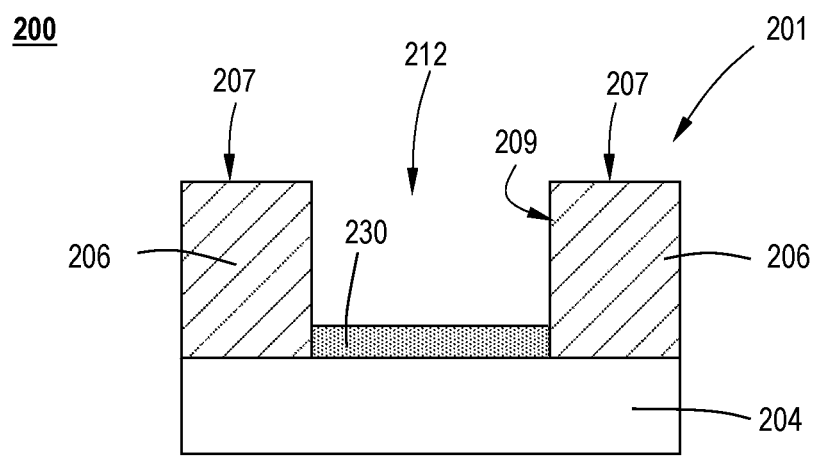
Figure 2G:
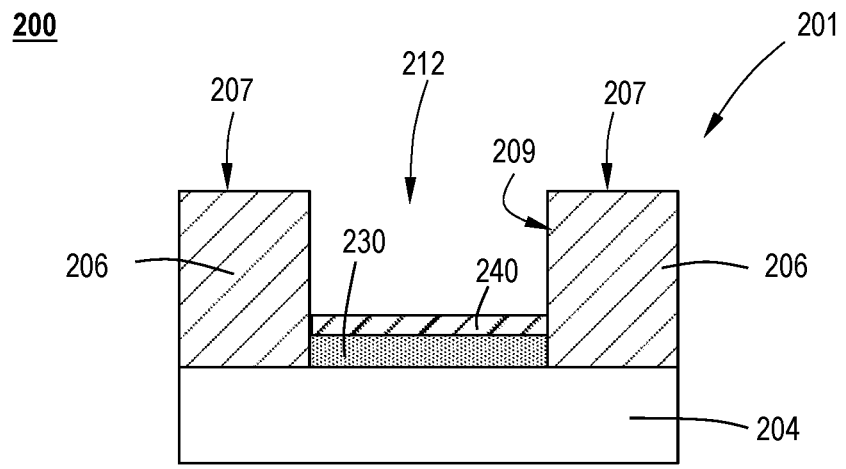
Figure 2H:
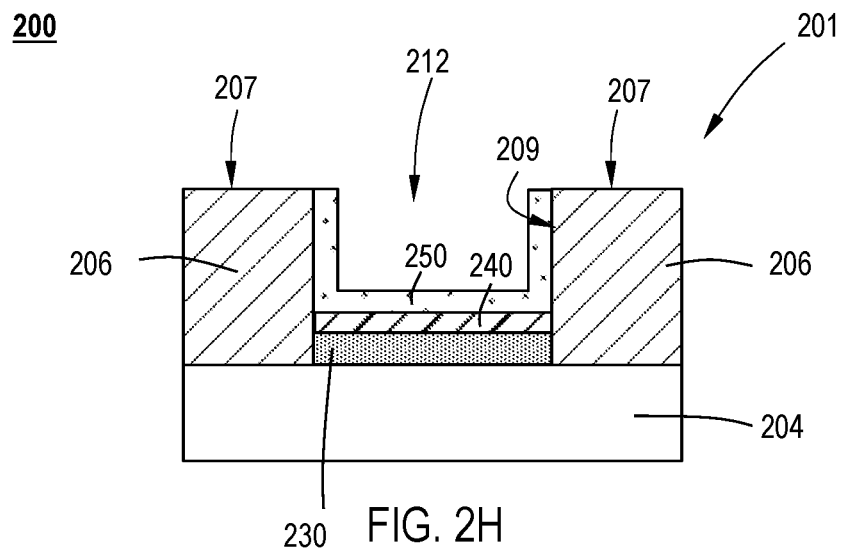
Figure 2I:
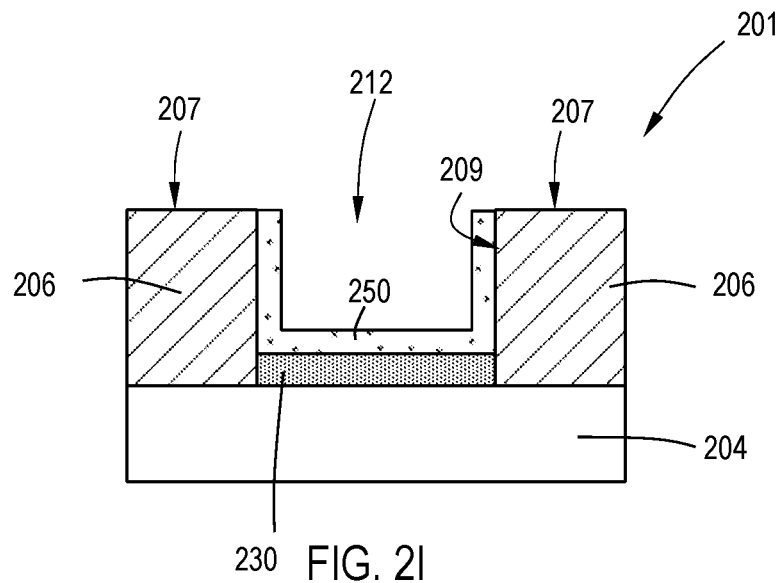
Figure 2J:
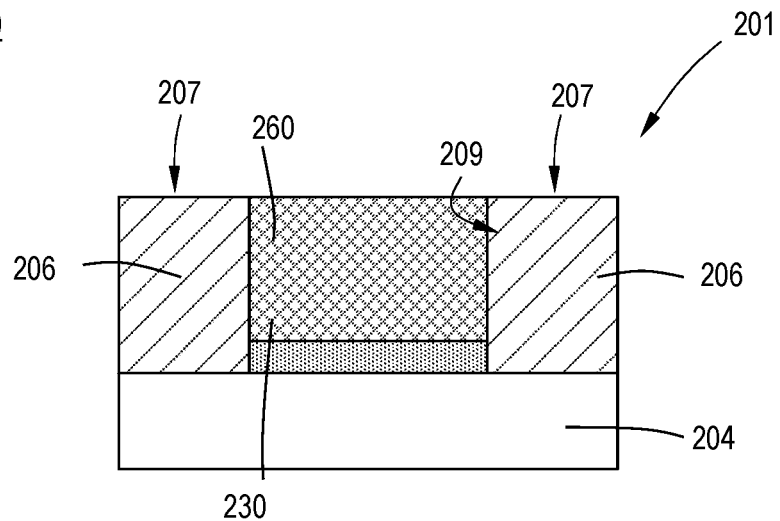
Figure 2K:
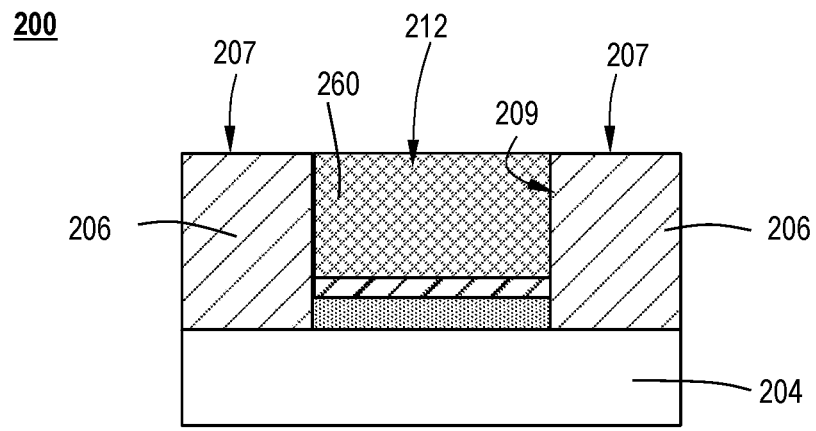
Figure 2L:
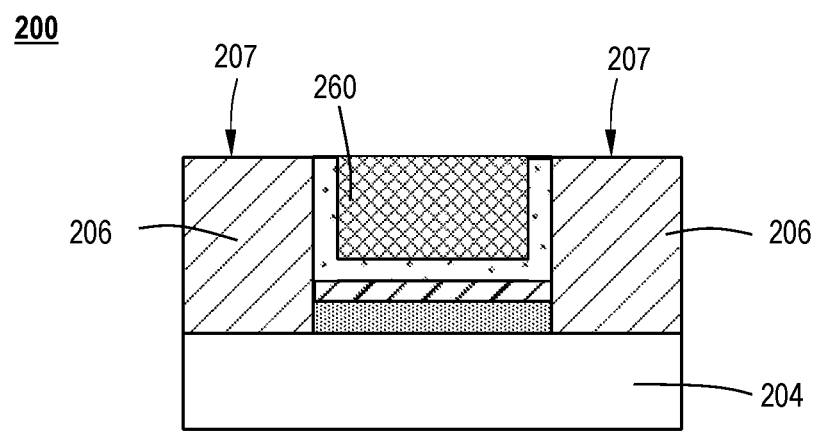
Figure 2M:
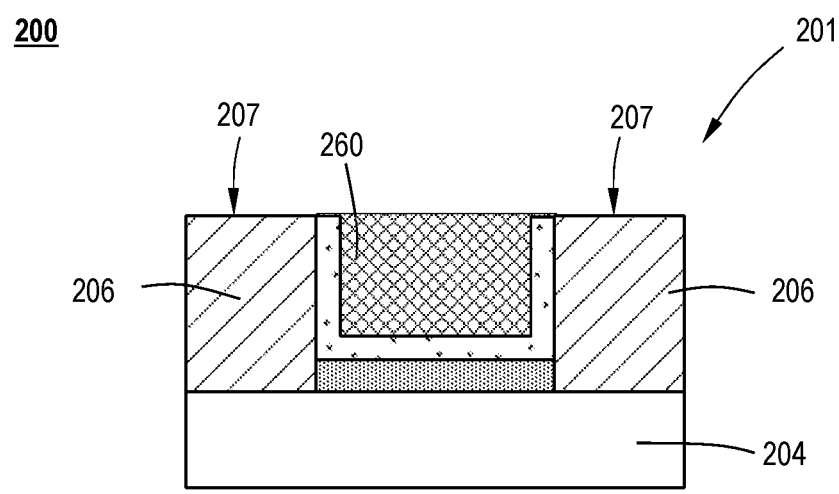

Referring to FIG. 1A and FIGS. 2F to 2I, the first metal film 220 is annealed at operation 150 to form an annealed first metal film 230. In some embodiments, the annealed first metal film 230 comprises a metal silicide. As illustrated in FIG. 2F, in one or more embodiments, there is no cap layer or liner, and, upon annealing, the first metal film 220 forms the annealed first metal film 230. As illustrated in FIG. 2G, in one or more embodiments, the device may include a cap layer 240 on the first metal film 220, and, upon annealing, the first metal film 220 forms the annealed first metal film 230. As illustrated in FIG. 2H, in one or more embodiments, the device may include a liner 250 on the cap layer 240 on the first metal film 220, and, upon annealing, the first metal film 220 forms the annealed first metal film 230. As illustrated in FIG. 2I, in some embodiments, the device includes a liner 250 formed on the first metal film 220, and, upon annealing, the first metal film 220 forms the annealed first metal film 230.

In some embodiments, at least operation 110, operation 120, and operation 150 are performed without breaking vacuum. Accordingly, in one or more embodiments, the substrate surface is cleaned, a metal film, e.g., a molybdenum film, is formed on the substrate surface, and the device is annealed without breaking vacuum between cleaning, forming the metal film, and annealing.

In some embodiments, at least operation 110, operation 120, operation 130, and operation 150 are performed without breaking vacuum. Accordingly, in one or more embodiments, the substrate surface is cleaned, a metal film, e.g., a molybdenum film, is formed on the substrate surface, a cap layer is formed on the metal film, and the device is annealed without breaking vacuum between cleaning, forming the metal film, forming the cap layer, and annealing.

In some embodiments, at least operation 110, operation 120, operation 140, and operation 150 are performed without breaking vacuum. Accordingly, in one or more embodiments, the substrate surface is cleaned, a metal film, e.g., a molybdenum film, is formed on the substrate surface, a liner is formed on the first metal film, and the device is annealed without breaking vacuum between cleaning, forming the metal film, forming the liner, and annealing.

In some embodiments, at least operation 110, operation 120, operation 130, operation 140, and operation 150 are performed without breaking vacuum. Accordingly, in one or more embodiments, the substrate surface is cleaned, a metal film, e.g., a molybdenum film, is formed on the substrate surface, a cap layer is formed on the metal film, a liner is formed on the cap layer, and the device is annealed without breaking vacuum between cleaning, forming the metal film, forming the cap layer, forming the liner, and annealing.

In some embodiments, annealing the device at operation 150 forms an annealed first metal film 230. In some embodiments, the annealed first metal film 230 has a thickness in a range of from 1.5 times to 3 times the thickness of the first metal film 220, or from 1.5 times to 2 times the thickness of the first metal film 220, or from 2 times to 3 times the thickness of the first metal film 220. In some embodiments, the annealed first metal film 230 has a thickness in a range of from 20 Å to 150 Å, from 20 Å to 100 Å, from 20 Å to 50 Å, from 50 Å to 150 Å, from 50 Å to 100 Å or from 100 Å to 150 Å.

In some embodiments, the annealed first metal film 230 has a root mean square (RMS) roughness in a range of from 4% to less than 30%, from 4% to less than 20%, from 4% to less than 10%, from 10% to less than 30%, from 10% to less than 20% or from 20% to less than 30%.

In some embodiments, the cap layer 240 may be formed, after annealing (operation 150) on the annealed first metal film 230. Referring to FIGS. 1C and 2G, in one or more embodiments, at operation 160, the annealed first metal film 230 is protected with a cap layer 240. The cap layer 240 may be formed according to any of the methods disclosed in operation 130. The cap layer 240 may comprise any suitable material known to the skilled artisan, including the materials of one or more embodiments. In some embodiments, at least operation 110, operation 120, operation 150, and operation 160 are performed without breaking vacuum. Accordingly, in one or more embodiments, the substrate surface is cleaned, a metal film, e.g., a molybdenum film, is formed on the substrate surface, the device is anneal, and a cap layer is formed on the annealed metal film without breaking vacuum between cleaning, forming the metal film, annealing, and forming the cap layer.

In some embodiments, a liner 250 may be formed on the annealed first metal film 230. With reference to FIG. 1C and FIG. 2G, in one or more embodiments, at operation 170, a liner 240 is formed on the annealed first metal film 230. Referring to FIG. 1B and FIG. 2H, in one or more embodiments, at operation 170, a liner 250 may be formed on the cap layer 240. The liner 250 may be formed according to any of the methods disclosed in operation 140. The liner 250 may comprise any suitable material known to the skilled artisan, including any of the materials described in one or more embodiments described above.

With reference to FIG. 1B, in some embodiments, at least operation 110, operation 120, operation 150, and operation 170 are performed without breaking vacuum. Accordingly, in one or more embodiments, the substrate surface is cleaned, a metal film, e.g., a molybdenum film, is formed on the substrate surface, the device is annealed, and a cap layer is formed on the annealed metal film without breaking vacuum between cleaning, forming the metal film, annealing, and forming the cap layer.

Referring to FIG. 1B, in some embodiments, at least operation 110, operation 120, operation 130, operation 150, and operation 170 are performed without breaking vacuum. Accordingly, in one or more embodiments, the substrate surface is cleaned, a metal film, e.g., a molybdenum film, is formed on the substrate surface, a cap layer is formed on the metal film, the device is annealed, and a liner if formed on the cap layer, without breaking vacuum between cleaning, forming the metal film, forming the cap layer, annealing, and forming the liner.

With reference to FIG. 1C, in some embodiments, at least operation 110, operation 120, operation 150, operation 160, and operation 170 are performed without breaking vacuum. Accordingly, in one or more embodiments, the substrate surface is cleaned, a metal film, e.g., a molybdenum film, is formed on the substrate surface, the device is annealed, a cap layer is formed on the annealed metal film, and a liner is formed on the cap layer without breaking vacuum between cleaning, forming the metal film, annealing, forming the cap layer, and forming the liner.

With respect to the FIGS. 1A to 1C and FIGS. 2J to 2M, the method of forming the semiconductor structure 200 comprises, at operation 180, filling the at least one feature 212 of the substrate 201 (or substrate surface). In some embodiments, filling the at least one feature comprises depositing a second metal film 260 on the first metal film 220, on the annealed first metal film 230, on the cap layer 240, or on the liner 250. In one or more embodiments, the second metal film 260 may be deposited by any suitable gap filling process known to the skilled artisan. In some embodiments, the gap filling process at operation 180 comprises exposure to the metal precursor, e.g., molybdenum halide, and reactant, e.g., hydrogen ($H_2$), as described in one or more embodiments above. In some embodiments, the second metal film 260 comprises a second molybdenum film. In some embodiments, the first molybdenum film and the second molybdenum film are the same. In some embodiments, the first molybdenum film and the second molybdenum film are different.

In other embodiments, the gap filling process of operation 180 comprises exposing the substrate 201 (or substrate surface) to a second metal precursor and exposing the substrate 201 (or substrate surface) to a second reactant. The first metal precursor and the second metal precursor can be the same or different. The first reactant and the second reactant can be the same or different. In some embodiments, the second metal precursor comprises a second molybdenum precursor. In some embodiments, the first molybdenum precursor and the second molybdenum precursor are the same. In some embodiments, the first molybdenum precursor and the second molybdenum precursor are different.

In some embodiments, the gap filling process of operation 180 is a bottom-up gap filling process. In one or more embodiments, the second metal film 260 is deposited on the first metal film 220, or on the annealed first metal film 230, or on the cap layer 240.

In other embodiments, the gap filling process of operation 180 comprises a conformal gap filling process. In some embodiments, the conformal gap filling process is performed on substrate 201 (or substrate surface) having a liner 250 thereon.

In one or more embodiments, the liner 250 overhangs the at least one feature. During the conformal gap filling process, exposure of the liner 250 to the second metal precursor etches and reduced the overhang. In one or more embodiments, the overhang is reduced by exposure to the molybdenum precursor without the presence of the reactant, so that there is more etching of the overhang and very little deposition of the molybdenum gap fill. In one or more embodiments, the overhang is reduced by exposure to the molybdenum precursor at a substantially lower concentration of the reactant, so that there is more etching of the overhang and very little deposition of the molybdenum gap fill. As used in this manner, the term "substantially lower concentration of the reactant" means that there are less than or equal to 80%, 60%, 40%, 20%, 10%, 5%, 2%, 1%, or 0% of the reactant concentration at operation 120. Once the overhang has been sufficiently etched, the reactant can be introduced and the at least one feature filled with the gap fill material, e.g., molybdenum. In some embodiments, the degree of etching can be modified by adjusting one or more parameter. The one or more parameters for etching the overhangs can be same or different as for the degree of etching of the underlayer substrate.

In some embodiments, at least operation 110, operation 120, operation 150 and operation 180 are performed without breaking vacuum. Accordingly, in one or more embodiments, the substrate surface is cleaned, a metal film, e.g., a molybdenum film, is formed on the substrate surface, the device is annealed, and a gap fill is performed, without breaking vacuum between cleaning, forming the metal film, annealing, and gap filling.

In some embodiments, at least operation 110, operation 120, operation 130, operation 150, and operation 180 are performed without breaking vacuum. Accordingly, in one or more embodiments, the substrate surface is cleaned, a metal film, e.g., a molybdenum film, is formed on the substrate surface, a cap layer is formed on the metal film, the device is annealed, and a gap fill is performed, without breaking vacuum between cleaning, forming the metal film, forming the cap layer, annealing, and gap filling.

In some embodiments, at least operation 110, operation 120, operation 140, operation 150, and operation 180 are performed without breaking vacuum. Accordingly, in one or more embodiments, the substrate surface is cleaned, a metal film, e.g., a molybdenum film, is formed on the substrate surface, a liner is formed on the metal film, the device is annealed, and a gap fill is performed, without breaking vacuum between cleaning, forming the metal film, forming the liner, annealing, and gap filling.

In some embodiments, at least operation 110, operation 120, operation 130, operation 140, operation 150, and operation 180 are performed without breaking vacuum. Accordingly, in one or more embodiments, the substrate surface is cleaned, a metal film, e.g., a molybdenum film, is formed on the substrate surface, a cap layer is formed on the metal film, a liner is formed on the cap layer, the device is annealed, and a gap fill is performed, without breaking vacuum between cleaning, forming the metal film, forming the cap layer, forming the liner, annealing, and gap filling.

In some embodiments, at least operation 110, operation 120, operation 150, operation 170, and operation 180 are performed without breaking vacuum. Accordingly, in one or more embodiments, the substrate surface is cleaned, a metal film, e.g., a molybdenum film, is formed on the substrate surface, the device is annealed, a liner is formed on the anneal metal film, and a gap fill is performed, without breaking vacuum between cleaning, forming the metal film, annealing, forming a liner, and gap filling.

In some embodiments, at least operation 110, operation 120, operation 130, operation 150, operation 170, and operation 180 are performed without breaking vacuum. Accordingly, in one or more embodiments, the substrate surface is cleaned, a metal film, e.g., a molybdenum film, is formed on the substrate surface, a cap layer is formed on the metal film, the device is annealed, a liner is formed, and a gap fill is performed, without breaking vacuum between cleaning, forming the metal film, annealing, forming the liner, and gap filling.

In some embodiments, at least operation 110, operation 120, operation 150, operation 160, and operation 180 are performed without breaking vacuum. Accordingly, in one or more embodiments, the substrate surface is cleaned, a metal film, e.g., a molybdenum film, is formed on the substrate surface, the device is annealed, a cap layer is formed on the anneal metal film, and a gap fill is performed, without breaking vacuum between cleaning, forming the metal film, annealing, forming a cap layer, and gap filling.

In some embodiments, at least operation 110, operation 120, operation 150, operation 160, operation 170, and operation 180 are performed without breaking vacuum. Accordingly, in one or more embodiments, the substrate surface is cleaned, a metal film, e.g., a molybdenum film, is formed on the substrate surface, the device is annealed, a cap layer is formed, a liner is formed, and a gap fill is performed, without breaking vacuum between cleaning, forming the metal film, annealing, forming the cap layer, forming the liner, and gap filling.

In another aspect of the disclosure, the method of forming the semiconductor structure 200 comprises breaking vacuum and/or performing the gap filling process (operation 180) in a separate processing chamber. In such embodiments where there is a vacuum break, the substrate 201 (or substrate surface) may comprise a cap layer 240 and/or a liner 250.

Referring to FIGS. 1A to 1C, in one or more embodiments, the method 100 includes an optional post-processing operation 190. In one or more embodiments, for example, the post-processing operation 190 may include a process to modify film properties (e.g., annealing) or a further film deposition process (e.g., additional ALD or CVD processes) to grow additional films. In one or more embodiments, the optional post-processing operation 190 may be a process that modifies a property of the deposited film. In some embodiments, the optional post-processing operation 190 comprises annealing the as-deposited film. In some embodiments, annealing is performed at temperature greater that a temperature of operation 120. In some embodiments, annealing is performed at temperatures in the range of from 100° C. to 550° C., from 100° C. to 450° C., from 100° C. to 350° C., from 100° C. to 250° C., from 200° C. to 550° C., from 200° C. to 450° C., from 200° C. to 350° C., from 300° C. to 550° C., from 300° C. to 450° C. or from 400° C. to 550° C. In some embodiments, the annealing is performed at a temperature in a range of from 100° C. to <550° C., from 100° C. to <450° C., from 100° C. to <350° C., from 100° C. to <250° C., from 200° C. to <550° C., from 200° C. to <450° C., from 200° C. to <350° C., from 300° C. to <550° C., from 300° C. to <450° C. or from 400° C. to <550° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)). Annealing can be performed for any suitable length of time. In some embodiments, the film is annealed for a predetermined time in the range of from 1 hour to 24 hour, from 1 hour to 20 hour, from 1 hour to 15 hour, from 1 hour to 10 hour, from 1 hour to 5 hour, from 5 hour to 24 hour, from 5 hour to 20 hour, from 5 hour to 15 hour, from 5 hour to 10 hour, from 10 hour to 24 hour, from 10 hour to 20 hour, from 10 hour to 15 hour, from 15 hour to 24 hour, from 15 hour to 20 hour or from 20 hour to 24 hour. In some embodiments, annealing the as-deposited film increases the density, decreases the resistivity and/or increases the purity of the film. In some embodiments, annealing is performed in an RTP chamber. In some embodiments, annealing in an RTP chamber is performed from spike anneal (micro second) to less than 10 mins. In some embodiments, annealing in an RTP chamber is performed for about 1 min. In some embodiments, the spike anneal is performed at a temperature less or equal to 900° C.

In some embodiments, the semiconductor structure 200 is moved from a first chamber to a separate, next chamber for further processing. The semiconductor structure 200 can be moved directly from the first chamber to the separate processing chamber, or semiconductor structure 200 can be moved from the first chamber to one or more transfer chambers, and then moved to the separate processing chamber. In some embodiments, the deposition of the first metal film 220 and the second metal film 260 can be done in a single chamber. In some embodiments, the deposition of the first metal film 220 and the deposition of the second metal film 260 is done in a separate chamber. Accordingly, the processing apparatus may comprise multiple chambers in communication with a transfer station. An apparatus of this sort may be referred to as a "cluster tool" or "clustered system", and the like. In some embodiments, a vacuum is maintained between the chambers such that the substrate remains substantially free of oxide.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, plasma nitridation, degas, orientation, hydroxylation and other substrate processes. By carrying out processes in a chamber on a cluster tool, surface contamination of the substrate 201 (or substrate surface) with atmospheric impurities can be avoided without oxidation prior to depositing a subsequent film.

According to one or more embodiments, the substrate 201 (or substrate surface) is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate 201 can be processed in single substrate deposition chambers, where a single substrate is loaded, processed and unloaded before another substrate is processed. The substrate 201 can also be processed in a continuous manner, similar to a conveyer system, in which multiple substrates are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate 201 can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate 201 can also be stationary or rotated during processing. A rotating substrate can be rotated (about the substrate axis) continuously or in discrete steps. For example, a substrate 201 may be rotated throughout the entire process, or the substrate 201 can be rotated by a small amount between exposures to different reactive or purge gases. Rotating the substrate 201 during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor structure, the method comprising:
    cleaning a substrate to form a substrate surface substantially free of oxide, the substrate including at least one feature having a bottom surface and a sidewall surface, the bottom surface comprising silicon germanium (SiGe), and the sidewall surface comprising a dielectric material;
    exposing the substrate surface to a first molybdenum precursor;
    exposing the substrate surface to a reactant to selectively deposit a first molybdenum film on the bottom surface; and
    forming a cap layer on the first molybdenum film or treating the first molybdenum film to form the cap layer, the cap layer comprising a metal nitride, a PVD metal, or combinations thereof,
    the method performed in a processing chamber without breaking vacuum.

2. The method of claim 1, wherein the substrate surface is exposed to the molybdenum precursor and the reactant sequentially or simultaneously.

3. The method of claim 2, wherein exposing the substrate surface to the reactant reduces etching of the substrate surface by the first molybdenum precursor.

4. The method of claim 1, wherein the reactant comprises one or more of an oxidizing agent and a reducing agent.

5. The method of claim 1, wherein the reactant comprises hydrogen ($H_2$), ammonia ($NH_3$), silane, polysilane, or combinations thereof.

6. The method of claim 1, wherein the first molybdenum precursor comprises molybdenum and a halide.

7. The method of claim 1, wherein the first molybdenum film has a thickness in a range of from 15 Å to 50 Å.

8. The method of claim 1, further comprising annealing the substrate.

9. The method of claim 8, wherein annealing forms a smooth substrate surface, the smooth surface comprises a root mean square (RMS) roughness in a range of from 4% to less than 30%.

10. The method of claim 1, wherein the at least one feature has an aspect ratio in a range of from 3:1 to 15:1.

11. The method of claim 10, further comprising filling the at least one feature with a second molybdenum film by exposing the at least one feature to a second molybdenum precursor and a second reactant.

12. The method of claim 11, further comprising depositing a liner in the at least one feature before filling the at least one feature with the second molybdenum film.

13. The method of claim 12, wherein the liner comprises a metal nitride or a PVD metal.

14. The method of claim 13, wherein exposing the substrate surface to the second molybdenum precursor reduces an overhang formed by the liner in the at least one feature.

15. A method of forming a semiconductor structure without breaking a vacuum, the method comprising:
    cleaning a substrate to form a substrate surface substantially free of oxide, the substrate surface comprising at least one feature having a bottom surface and a sidewall surface, the bottom surface comprising silicon germanium (SiGe), and the sidewall surface comprising a dielectric material;

performing a first operation on the substrate surface, the first operation comprising exposing the substrate surface to a first molybdenum precursor and exposing the substrate surface to a reactant to selectively deposit a first molybdenum film on the bottom surface;

treating the bottom surface to form or deposit one or more of a cap and a liner; and annealing the substrate.

16. A method of forming a semiconductor structure, the method comprising:

performing the method of claim 15;

performing a second deposition operation on the substrate surface, the second deposition process comprising exposing the substrate surface to a second molybdenum precursor and exposing the substrate surface to a second reactant to deposit a second molybdenum film on the substrate surface.

* * * * *